United States Patent
Higashi et al.

[11] Patent Number: 5,266,443
[45] Date of Patent: Nov. 30, 1993

[54] PRESENSITIZED PLATES FOR LITHOGRAPHY NOT REQUIRING DAMPENING WITH WATER

[75] Inventors: Tatsuji Higashi, Shizuoka; Toshio Ohba, Annaka, both of Japan

[73] Assignees: Fuji Photo Film Co., Ltd., Minami-Ashigara; Shin-Etsu Chemical Co., Ltd., Tokyo, both of Japan

[21] Appl. No.: 726,811

[22] Filed: Jul. 8, 1991

[30] Foreign Application Priority Data

Jul. 9, 1990 [JP] Japan .................... 2-181250

[51] Int. Cl.$^5$ .................... G03C 1/76; G03F 7/00
[52] U.S. Cl. .................... 430/272; 430/303
[58] Field of Search .................... 430/272, 303

[56] References Cited

U.S. PATENT DOCUMENTS

| | | | |
|---|---|---|---|
| 4,775,607 | 10/1988 | Schlosser | 430/303 X |
| 4,874,686 | 10/1989 | Urabe et al. | 430/272 |
| 4,937,169 | 6/1990 | Schlosser | 430/272 X |
| 5,126,228 | 6/1992 | Highashi et al. | 430/272 |

FOREIGN PATENT DOCUMENTS

| | | |
|---|---|---|
| 0333156 | 9/1989 | European Pat. Off. |
| 0333186 | 9/1989 | European Pat. Off. |
| 0386777 | 9/1990 | European Pat. Off. |
| 3924592 | 2/1990 | Fed. Rep. of Germany |
| 3930797 | 3/1990 | Fed. Rep. of Germany |
| 1441610 | 7/1976 | United Kingdom ............... 430/303 |

*Primary Examiner*—Roland Martin
*Attorney, Agent, or Firm*—Burns, Doane, Swecker & Mathis

[57] ABSTRACT

A dry PS plate having a substrate provided thereon with a photopolymerizable light-sensitive layer and a silicone rubber layer in that order. The silicone rubber layer comprises a product obtained by crosslinking through addition reaction the following components:

(a) an alkenylpolysiloxane having at least two alkenyl groups directly bonded to the silicon atoms in each molecule thereof; and (b) a hydrogen polysiloxane of the following general formula I:

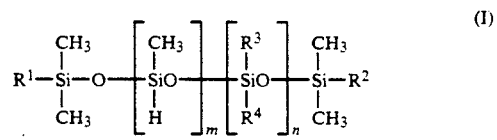

wherein $R^1$ and $R^2$ independently represent a hydrogen atom or methyl group, $R^3$ and $R^4$ independently represent a methyl, vinyl or phenyl group, $m+n$ is 5 to 30 and $m:n$ is 3:1 to 1:3. The dry PS plate provides a lithographic printing plate exhibiting excellent tone reproducibility and printing durability as well as not being subject to background contamination.

20 Claims, No Drawings

PRESENSITIZED PLATES FOR LITHOGRAPHY NOT REQUIRING DAMPENING WITH WATER

BACKGROUND OF THE INVENTION

1. Field of the Invention

The present invention relates to a presensitized plate for use in making a lithographic printing plate which makes it possible to perform printing without using water to dampen the plate.

2. Prior Art

There have been proposed various kinds of presensitized plates for use in making lithographic printing plates not requiring dampening with water (hereunder referred to as "dry PS plates") in order to carry out lithographic printing operations. Among them, those plates comprising a substrate coated thereon with a photopolymerizable light-sensitive resin layer and a silicone rubber layer in that order show quite excellent properties, as disclosed in, for instance, Japanese Patent Publication for Opposition Purposes (hereinafter referred to as "J.P. KOKOKU") Nos. Sho 54-26923 (U.S. Pat. No. 3,894,873) and Sho 55-22781.

In those dry printing plates, the silicone rubber layer is generally obtained by partially crosslinking macromolecular polymers having a polysiloxane chain as a main skeleton with a crosslinking agent. The following two methods for curing the silicone rubber layer are known:

(1) a condensation method wherein an organopolysiloxane having hydroxyl groups at both terminal ends is crosslinked with a silane or siloxane having a hydrolyzable functional group to obtain silicone rubber; and (2) an addition method wherein an addition reaction of a polysiloxane containing ≡Si—H groups and a polysiloxane containing —CH=CH— groups is carried out to obtain a silicone rubber as disclosed in Japanese Laid-open Patent Application (hereinafter referred as "J.P. KOKAI") No. 61-73156 and Japanese Patent Applications No. 1-301568.

The condensate type silicone rubber produced by method (1) has the drawback that it is difficult to obtain a stable dry PS plate which does not fluctuate in sensitivity. This is because curability and adhesion to the light-sensitive layer may vary depending on the moisture content during curing. Therefore, the adduct type silicone rubber which does not have the above drawback would be superior.

As the photosensitive resin layer of the positive-working presensitized plate for use in making a lithographic printing plate (hereinunder referred to as a "PS plate"), generally utilized is a photopolymerizable type light-sensitive composition which is curable by light exposure. In the image production process of the PS plate having the foregoing layer structure, the non-image areas are produced by curing the light-sensitive composition by light exposure and, if necessary, by causing photoadhesion at the interface between the silicone rubber layer and the light-sensitive layer to ensure firm adhesion between the two layers and to avoid the penetration of the developer into the photosensitive layer and hence the dissolution of the light-sensitive composition. On the other hand, the image areas are produced by penetrating the developer into the light-sensitive layer through the silicone rubber layer to partially or fully dissolve the light-sensitive resin layer and physically removing the silicone rubber layer. In such an imaging process, it has been difficult to simultaneously sufficiently avoid background contamination (the term "contamination" refers small spots of printing ink which deleteriously adhere to the non-imaged areas), printing durability and tone reproducibility with a dry PS plate containing a conventional adduct type silicone rubber layer. That is, the printing durability can be improved by raising the degree of curing, but the higher the degree of curing the less well background contamination is avoided and the poorer the tone reproducibility. On the other hand, a lower degree of curing may make it possible to avoid the contamination better (referred to as "anti-contamination characteristics" hereinafter) and improve tone reproducibility, but it adversely affects the printing durability.

SUMMARY OF THE INVENTION

Accordingly, an object of the present invention is to provide a dry PS plate of which the degree of curing of the silicone rubber layer is suitably controlled so that the PS plate yields a lithographic printing plate exhibiting excellent tone reproducibility as well as excellent anti-contamination characteristics and printing durability.

The inventors of the present invention have found that the object can be attained by a dry PS plate which comprises a substrate provided thereon with a photopolymerizable light-sensitive layer and a silicone rubber layer in that order, wherein the silicone rubber layer is crosslinked with specific crosslinking agents.

Thus, the present invention relates to a dry PS plate which comprises a substrate provided thereon with a photopolymerizable light-sensitive layer and a silicone rubber layer in that order, wherein the silicone rubber layer comprises a product obtained by crosslinking through addition reaction the following components;

(A) an alkenylpolysiloxane having at least two alkenyl groups directly bonding to the silicon atoms in each molecule thereof, and (B) a hydrogen polysiloxane of the following general formula I:

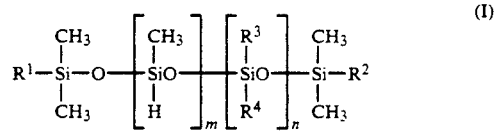

wherein $R^1$ and $R^2$ independently represent a hydrogen atom or methyl group, $R^3$ and $R^4$ independently represent a methyl, vinyl or phenyl group, $m+n$ is 5 to 30 and $m:n$ is 3:1 to 1:3.

DESCRIPTION OF THE PREFERRED EMBODIMENTS

The preferred embodiments of the dry PS plate according to the present invention will hereunder be described in more detail.

The dry PS plate of the present invention must yield a lithographic printing plate which has sufficient flexibility to allow the printing plate to be set on the usual printing press and which can withstand the load applied thereto during the printing operation. Examples of typical substrates for the dry PS plate of the invention include coated paper, a metal plate such as an aluminum plate, a plastic film such as a polyethylene terephthalate film, a rubber plate and composite plates. The surface of the substrate can be coated with a primer layer or the like for preventing halation and for other purposes.

For the preparation of the primer layer, various materials can be employed to improve the adhesion between the substrate and the photopolymerizable light-sensitive layer, to prevent halation, to dye images and/or to enhance the printing properties of the resulting lithographic printing plate. Examples of these materials include those obtained by exposing to light a variety of light-sensitive polymers to cure them prior to the application of the photopolymerizable light-sensitive layer, as disclosed in J.P. KOKAI No. Sho 60-229031; those obtained by heat curing of epoxy resins, as disclosed in J.P. KOKAI No. Sho 62-50760; those obtained by hardening gelatin films, as disclosed in J.P. KOKAI No. Sho 63-133151; those using urethane resin as disclosed in Japanese Patent Application Nos. Hei 1-282270 and 2-21072 and hardened casein films. The primer layer may be admixed with a polymer having a glass transition point lower than room temperature such as those selected from polyurethanes, polyamides, styrene/butadiene rubbers, carboxyl-modified styrene/butadiene rubbers, acrylonitrile/butadiene rubbers, carboxyl-modified acrylonitrile/butadiene rubbers, polyisoprenes and acrylate rubbers, aiming at softening the primer layer. The amount of the polymer to be added is not particularly limited, and the primer layer may composed of the polymer alone as far as a film can be formed with the polymer.

The primer layer may also comprise, depending on the foregoing purposes, additives, for instance, dyes, pH indicators, agents or compositions for obtaining a visible image immediately after imagewise exposure to light, photopolymerization initiators, adhesion improvers (such as polymerizable monomers, diazo resins, silane coupling agents, titanate coupling agents or aluminum coupling agents), white pigments and/or silica powder. The amount of the primer layer to be coated ranges in general from 0.1 to 20 g/m$^2$, preferably from 1 to 10 g/m$^2$ (determined after drying).

The photopolymerizable light-sensitive layer comprises (a) a monomer or oligomer having at least one photopolymerizable olefinically unsaturated double bond, (b) an organic solvent-soluble polymeric compound being solid at room temperature and having film-forming ability, and (c) a photopolymerization initiator.

Component (A) A Monomer or Oligomer Having at Least One Photopolymerizable Olefinically Unsaturated Double Bond Examples of the monomers or oligomers having at least one photopolymerizable ethylenically unsaturated double bond which can be used in the present invention include monofunctional (meth) acrylates such as polyethylene glycol mono(meth)acrylate, polypropylene glycol mono(meth)acrylate, phenoxyethyl (meth) acrylate, 2-(meth)acryloxyethyl hydrogen phthalate and 2-(meth) acryloxyethyl hydrogen succinate; polyethylene glycol di(meth) acrylate, polypropylene glycol di(meth)acrylate, trimethylolethane tri(meth)acrylate, neopentyl glycol di(meth) acrylate, pentaerythritol tri(meth)acrylate, pentaerythritol tetra(meth)acrylate, dipentaerythritol hexa(meth)acrylate, hexanediol di(meth)acrylate, trimethylolpropane tri(acryloyloxypropyl) ether, tri(acryloyloxyethyl) isocyanurate, calcium (meth)acrylate, sodium (meth)acrylate; monomers or oligomers obtained by adding ethylene oxide or propylene oxide to polyfunctional alcohols such as glycerin and trimethylolethane and then esterified with (meth)acrylic acids; urethane acrylates as disclosed in J.P. KOKOKU Nos. 48-41708 and 50-6034 and J.P. KOKAI No. 51-37193; polyester acrylates as disclosed in J.P. KOKAI No. 48-64183 and J.P. KOKOKU Nos. 49-43191 and 52-a30490; polyfunctional (meth)acrylate such as epoxy acrylates obtained by reacting epoxy resins and (meth)acrylic acid; and N-methylolacrylamide derivatives as disclosed in U.S. Pat. No. 4,540,649. Moreover, those disclosed as photocuring monomers and oligomers in NIPPON SETCHAKU KYOKAI SHI (Bulletin of Japan Adhesive Association), Vol. 20, No. 7, pp. 300–308 (1984) may be used in the invention.

Further, there may also be mentioned reaction products between allyl isocyanate or

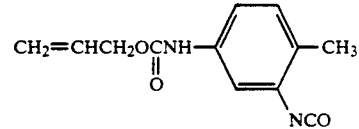

and one or more of the following: a hydroxy group-containing (meth)acrylate such as hydroxyethyl (meth)acrylates, hydroxypropyl (meth)acrylates, polyethylene glycol mono(meth) acrylates, polypropylene glycol mono(meth)acrylatse, pentaerythritol tri(meth)acrylates, dipentaerythritol tetra(meth)acrylates,

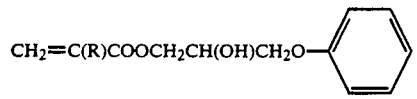

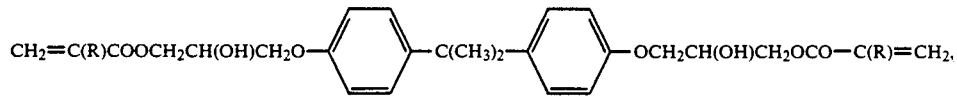

and

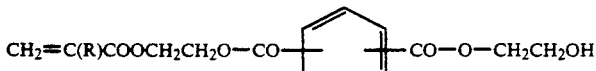

wherein R is a hydrogen atom or methyl group; reaction products between allyl glycidyl ether and a carboxyl group-containing (meth)acrylate such as (meth)acrylic acids, (meth)acryloxyethyl hydrogen phthalates, (meth)acryloxyethyl hydrogen succinates, (meth)acryloxyethyl hydrogen maleates, (meth)acryloxyethyl hydrogen tetrahydrophthalates and (meth)acryloxyethyl hydrogen hexahydrophthalates; reaction products between allyl alcohol or 2-allyloxyethyl alcohol and the above-mentioned (meth)acrylate compounds having carboxyl group or its acid chloride group; and reaction products between an amine compound such as xylylenediamine, ethylenediamine, isophoronediamine and monoethanolamine and glycidyl (meth)acrylates or allyl glycidyl ether. These monomers or oligomers may be used alone or in any combination. The amount of the monomers or oligomers used in the photopolymerizable light-sensitive layer ranges from about 5% to about 75%, and preferably 10 to 60% by weight based on the total solid weight of the photopolymerizable light-sensitive layer.

Component (B): An Organic Solvent-Soluble Polymeric Compound Being Solid at Room Temperature and Having Film-Forming Ability The above-titled polymeric compounds used in the present invention include polyurethane resins and polyamide resins. The polyurethane resins include products obtained by reacting a diisocyanate and a diol in a substantially equimolar ratio and those obtained by reacting a slightly excessive amount of a diisocyanate with a diol and then chain-extending with a diamine, a diol or water. Typical examples of diisocyanates include toluene diisocyanate, xylylene diisocyanate, diphenylmethane diisocyanate, hexamethylene diisocyanate, isophorone diisocyanate, diphenyl ether diisocyanate, hydrogenated xylylene diisocyanate, cyclohexane diisocyanate, hydrogenated diphenylmethane diisocyanate, tetramethylxylylene diisocyanate and lysine diisocyanate. Typical examples of diols include polypropylene glycol, polyethylene glycol, polytetramethylene glycol, ethylene oxide/propylene oxide copolymers, tetrahydrofuran/ethylene oxide copolymers, tetra hydrofuran/propylene oxide copolymers, polyester diols such as polyethylene adipate, polydiethylene adipate, polypropylene adipate, polyhexamethylene adipate, polyneopentyl adipate, polyhexamethylene neopentyl adipate, polyethylene diethylene adipate, polyethylene hexamethylene adipate, poly- $\epsilon$-caprolactone diol, polyhexamethylene carbonate diol and polytetramethylene adipate. It is also possible to use branched polyurethane resins such as those obtained by replacing a part or whole of a diisocyanate with a tri or more functional isocyanate compound (e.g., those obtained by adding three moles of 2,4-toluene diisocyanate to one mole of trimethylol propane, undecane triisocyanate, dicycloheptane triisocyanate and 1,8-diisocyanate-4-isocyanate methyloctane) and simultaneously replacing a part of a diol with a monofunctional alcohol (e.g., allyl alcohol, allyloxyethyl alcohol, hydroxyethyl (meth)acrylate, polyethylene glycol mono(meth)acrylate, polypropylene glycol (meth)acrylate, hydroxypropyl mono(meth)acrylate, benzyl alcohol and ethyl alcohol). In addition, there may be used polyurethane resins derived from a diol having a special functional group such as an alkyl dialkanol amine, a (meth)acrylate group-containing diol and a carboxyl group-containing diol, in particular an alkaline water-soluble polyurethane resin derived from a carboxyl group-containing diol as disclosed in J.P.KOKAI Nos. Sho 63-287942 and 63-287943.

Examples of polyamide resins include known copolymerized polyamides and N-substituted polyamides which are soluble in an organic solvent such as an alcohol. There may be mentioned two component copolymers (nylon 6/66 copolymer) consisting of a polycapramide component (nylon 6) and a polyhexamethylene adipamide component (nylon 66), nylon 6/66/610 copolymers obtained by copolymerizing a polyhexamethylene sebacamide component (nylon 610) with the components of nylon 6/66, copolymerized polyamides such as nylon 6/66/12 copolymers, nylon 6/66/PACM-6 copolymers and nylon 6/66/PACM-8 copolymers obtained by copolymerizing as a third component a polylauroamide component (nylon 12 component), a poly-di(p-aminocyclohexyl)methane adipamide component (nylon PACM-6 component) and poly-di(p-aminocyclohexyl)methane suberamide component (nylon PACM-8 component) respectively, N-methylol substituted, N-alkoxymethylated and N-allyloxymethylated derivatives of various polyamides. In addition, there may be suitably used those obtained by copolymerizing 1,3-bis(aminomethyl)cyclohexane and cyclohexane-1,4-dicarboxylic acid with the above-mentioned amide components as disclosed in J.P.KOKAI No Sho 51-74704. Examples of water-soluble or water-dispersible polyamide resins include sulfonic acid or sulfonate group-containing polyamides obtained by copolymerizing sodium 3,5-dicarboxybenzenesulfonate as disclosed in J.P.KOKAI No. Sho 48-72250, ether bond-containing polyamides obtained by copolymerizing at least one of dicarboxylic acid, diamine and cyclic amide containing ether bond in the molecule as disclosed in J.P.KOKAI No. Sho 49-43565, basic nitrogen atom-containing polyamides obtained by copolymerizing N,N'-di($\gamma$-aminopropyl) piperazine and polyamides obtained by quaternarizng the basic nitrogen atom-containing polyamides with acrylic acid or the like as disclosed in J.P.KOKAI No. Sho 50-7605, copolyamides containing polyether segments having a molecular weight of from 150 to 1500 as disclosed in J.P.KOKAI No. Sho 55-74537, and polyamides obtained by ring opening polymerization of $\alpha$- (N,N'-dialkylamino)-$\epsilon$-caprolactam or ring opening copolymerization of $\alpha$-(N,N'-dialkylamino)- $\epsilon$-caprolactam and $\epsilon$-caprolactam. In addition, there may be mentioned as useful polyamides, products of addition polymerization between an organic diisocyanate and an amide compound having primary and/or secondary amide groups at both terminal ends and at least one amide bond as disclosed in J.P.KOKAI No. Sho 58-140737.

Examples of the polymeric compound used in the present invention further include methacrylic acid copolymers, acrylic acid copolymers, crotonic acid copolymers, maleic acid copolymers, partially esterified maleic acid copolymers, acidic cellulose derivatives, polyvinyl pyrrolidones, polyethylene oxides, polyesters, unsaturated polyesters, polystyrenes, epoxy resins, phenoxy resins, polyvinyl butyrals, polyvinyl formals, polyvinyl chlorides, polyvinyl alcohols, partial acetals of polyvinyl alcohols, gelatin and water-soluble cellulose derivatives.

In addition, the film-forming polymeric compounds used in the present invention include those containing photopolymerizable or photo-crosslinkable olefinic unsaturated double bonds in their side chains. Examples of such polymeric compounds include copolymers of allyl (meth)acrylate/(meth) acrylic acid/optional other addition polymerizable vinyl monomers and their alkali metal salts or amine salts as disclosed in J.P. KOKAI No. Sho 59-53836; compounds obtained by reacting hydroxyethyl (meth)acrylate/(meth)acrylic acid/alkyl (meth) acrylate copolymers and their alkali metal salts or amine salts with a (meth)acrylic acid chloride, as disclosed in J.P. KOKOK0 No. 59-45979; compounds obtained by adding pentaerythritol triacrylate to maleic anhydride copolymers through half-esterification and their alkali metal salts or amine salts, as disclosed in J.P. KOKAI No. Sho 59-71048; compounds obtained by adding a monohydroxyalkyl (meth)acrylate, polyethylene glycol mono(meth)acrylate or polypropylene glycol mono(meth)acrylate to a styrene/maleic anhydride copolymer through half-esterification, as well as their alkali metal salts or amine salts; compounds obtained by reacting some of the carboxyl groups of (meth)acrylic acid copolymers or crotonic acid copolymers with a glycidyl (meth)acrylate and the alkali metal salts or amine salts of such compounds; compounds obtained by reacting hydroxyalkyl (meth)acrylate copolymers, polyvinyl formal or polyvinyl butyral with maleic anhydride or itaconic anhydride as well as their alkali metal salts or amine salts; compounds obtained by reacting hydroxyalkyl (meth) acrylate/(meth)acrylic acid copolymers with 1:1 adduct of 2,4-tolylene diisocyanate and hydroxyalkyl (meth)acrylate, as well as their alkali metal salts or amine salts; (meth)acrylic acid copolymers partially reacted with allyl glycidyl ether, as well as their alkali metal salts or amine salts, as disclosed in J.P. KOKAI No. Sho 59-53836; vinyl (meth)acrylate/(meth)acrylic acid coplymers and their alkali metal salts or amine salts; allyl (meth)acrylate/sodium styrenesulfonate copolymers; vinyl (meth)acrylate/sodium styrenesulfonate copolymers; allyl (meth) acrylate/sodium acrylamido-1,1-dimethylethylenesulfonate copolymers; vinyl (meth)acrylate/sodium acrylamido-1,1-dimethylethylenesulfonate copolymers; 2-allyloxyethyl (meth) acrylate/(meth)acrylic acid copolymers; and 2-allyloxyethyl (meth)acrylate/2-(meth)acryloxyethyl hydrogen succinate copolymers. These polymers may be used alone or in combination.

The weight ratio of the polymeric compound (b) to the monomer or oligomer (a) preferably ranges from 99:1 to 30:70, and more preferably 97:3 to 35:65.

Component (C): Photopolymerization Initiator

Examples of the photopolymerization initiators used in the present invention include vicinal polyketaldonyl compounds as disclosed in U.S. Pat. No. 2,367,660; α-carbonyl compounds as disclosed in U.S. Pat. Nos. 2,367,661 and 2,367,670; acyloin ethers as disclosed in U.S. Pat. No. 2,448,828; aromatic acyloin compounds of which the α-position is substituted with a hydrocarbon group as disclosed in U.S. Pat. No. 2,722,512; polynuclear quinone compounds as disclosed in U.S. Pat. Nos. 3,046,127 and 2,951,758; a combination of a triarylimidazole dimer and p-aminophenyl ketone as disclosed in U.S. Pat. No. 3,549,367; benzothiazole compounds as disclosed in U.S. Pat. No. 3,870,524; benzothiazole compounds/trihalomethyl-s-triazine compounds as disclosed in U.S. Pat. No. 4,239,850; acridine and phenadine compounds as disclosed in U.S. Pat. No. 3,751,259; oxadiazole compounds as disclosed in U.S. Pat. No. 4,212,970; trihalomethyl-s-triazine compounds having a chromophoric group as disclosed in U.S. Pat. Nos. 3,954,475, 4,189,323, J.P. KOKAI Sho Nos. 53-133428, 60-105667, 62-58241 and 61-227489; and peroxy ester compounds containing a benzophenone group as disclosed in J.P. KOKAI Nos. 59-197401 and 60-76503. Those photopolymerization initiators may be used alone or in combination.

The amount of the photopolymerization initiator to be added is in the range of from 0.1 to 20%, preferably from 1 to 15% by weight based on the total light-sensitive layer.

Other Components of the Photopolymerizable Light-Sensitive Layer

In addition to the foregoing components, the photopolymerizable light-sensitive composition preferably comprises a heat polymerization inhibitor. Examples of useful heat polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzimidazole. Further, the photopolymerizable light-sensitive composition may optionally comprise dyes or pigments for coloring the photopolymerizable light-sensitive layer and/or pH indicators or leuco dyes as agents or compositions for obtaining a visible image immediately after imagewise exposure. The photopolymerizable light-sensitive composition may further comprise a small amount of a silicone compound such as polydimethyl siloxane, methylstyrene-modified polydimethyl siloxane, olefin-modified polydimethyl siloxane, polyether-modified polydimethyl siloxane, silane coupling agents, silicone diacrylate or silicone dimethacrylate. In order to improve the coating properties of the light-sensitive composition, a silicon atom-containing surfactant or a fluorine atom-containing surfactant can be incorporated into the light-sensitive composition. Moreover, a diazo resin may be added to the photopolymerizable light sensitive composition for improving the adhesion between the photopolymerizable light-sensitive layer and the primer layer. The amount of these additives to be added to the photopolymerizable light-sensitive composition is in general not more than 10% by weight based on the total weight of the composition.

It is also possible to add, to the photopolymerizable light-sensitive composition, other radical initiator such as hexaaryl bisimidazole, as disclosed in J.P.KOKAI Nos. Sho 61-23603 and 57-21401 and U.S. Pat. No. 4,565,769, in an amount of 0.5 to 10% by weight based on the total weight of the light-sensitive layer in order to improve the sensitivity of the photopolymerizable light-sensitive layer Moreover, it is also possible to add, to the photopolymerizable light-sensitive composition, silica powder or hydrophobic silica powder whose surface is treated with a (meth)acryloyl group- and/or allyl group-containing silane coupling agent in an amount of not more than 50% by weight of the composition in order to improve the adhesion between the photopolymerizable light-sensitive layer and the silicone rubber layer provided thereon.

The composition for the foregoing light-sensitive layer is dissolved in a proper solvent such as propylene glycol methylethyl ether acetate, 2-methoxyethanol, 2-methoxyethyl acetate, methyl lactate, ethyl lactate, propylene glycol monomethyl ether, methanol, ethanol, methyl ethyl ketone, water or any combination thereof, then applied to the substrate and dried. The amount of the layer coated suitably ranges from about 0.1 to 10 g/m$^2$, preferably from 0.5 to 5 g/m$^2$ (weighed after drying).

Silicone Rubber Layer

The silicone rubber layer used in the present invention, which is crosslinked by an addition reaction, has the advantages that (1) the curing properties are relatively uninfluenced by humidity during the curing reaction, and (2) the layer may be crosslinked at a higher rate to easily give a silicone rubber layer having certain desired properties.

The condensation type silicone rubber composition may be insufficiently cured, depending on the crosslinking agent used, if a carboxylic acid is present in the photopolymerizable light-sensitive layer. On the contrary, the addition type silicone rubber composition may cure sufficiently even if a carboxylic acid is present in the photopolymerizable light-sensitive layer. Thus, when using the addition type silicone rubber composition, the photopolymerizable light-sensitive layer may contain a carboxylic acid and therefore it can be developed with a developer comprising mainly water or alkaline water, which makes it possible to design a presensitized plate easily.

The addition type silicone rubber layer used in the present invention comprises a product obtained by crosslinking through addition reaction the following components: (A) an alkenyl polysiloxane having at least two alkenyl groups directly bonded to the silicon atoms in each molecule thereof; and (B) a hydrogen polysiloxane of the following general formula I:

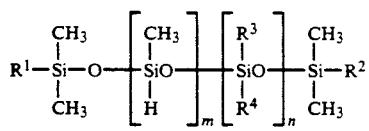

wherein R$^1$ and R$^2$ independently represent a hydrogen atom or methyl group, R$^3$ and R$^4$ independently represent a methyl, vinyl, or phenyl group, m+n is 5 to 30 and m:n is 3:1 to 1:3.

The alkenylpolysiloxane according to the present invention has at least two alkenyl groups directly bonded to the silicon atoms in each molecule thereof. Examples of the alkenyl group include vinyl, allyl, butenyl, hexenyl and decenyl groups. The organic groups directly bonded to the silicon atoms other than the alkenyl group may be selected from, for example, an alkyl group such as methyl, ethyl, propyl, butyl and hexyl; aryl group such as phenyl; aralkyl group such as β-phenylethyl and β-phenylpropyl; halogen-substituted hydrocarbon group such as chloromethyl and 3,3,3-trifluoropropyl. Among these organic groups, the methyl group is preferred since using a methyl group makes the synthesis of the polysiloxane easy and also provides a cured coating with excellent printing ink repellency.

The viscosity of the alkenylpolysiloxane is not particularly limited. However, the viscosity is desirably not less than 60 cs in view of the curing properies. When the viscosity exceeds 50000 cs it is desirable to dissolve the alkenylpolysiloxane in an organic solvent in order to make it possible to apply it as a thin film having a thickness of a few μm.

The hydrogen polysiloxane according to the invention has the following general formula I:

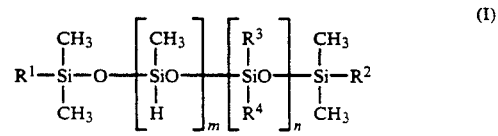

wherein R$^1$ and R$^2$ independently represent a hydrogen atom or methyl group, R$^3$ and R$^4$ independently represent a methyl, vinyl, or phenyl group.

When the value of m+n is less than 5, it is difficult to form the silicone rubber layer since the curability of the layer becomes unduly low. On the other, when m+n is more than 30, the tone reproducibility and the anti-contamination property deteriorate. Therefore, the value of m+n is preferably 5 to 30. Further, if the ratio of m:n is smaller than 1:3, the curability of the silicone rubber layer becomes insufficient so that it is difficult to produce the silicone rubber layer in a reasonable short period. If the ratio is larger than 3:1, the degree of curing of the cured silicone rubber layer would become unduly high so that the anti-contamination property and the tone reproducibility would be unacceptably low. Therefore, the ratio of m:n is preferably selected from the range of from 1:3 to 3:1.

The hydrogen polysiloxane of the formula I may be a mixture of various copolymers of the formula I and the molecular weight thereof may vary within a certain range. Therefore, the value of m+n and the ratio of m:n are represented as average values.

The alkenylpolysiloxane and the hydrogen polysiloxane are mixed so that the mixture contains more than 1 equivalent, preferably 3 to 15 equivalents of the SiH group to the carbon/carbon unsaturated group.

The addition catalyst for the silicone rubber composition may be selected from any known such catalyst, but particularly preferred are platinum compounds such as platinums coordinated with olefins.

The composition for the silicone rubber layer may further comprise an addition reaction retardant such as tetracyclo(methylvinyl)siloxane and carbon-carbon triple bond-containing alcohols, for the purpose of controlling the curing rate of the composition.

In addition to the foregoing components, the composition for the silicone rubber layer may comprise a known adhesion-imparting agent such as an alkenyl trialkoxysilane, a hydroxyl group-containing organopolysiloxane consisting of a condensation type silicone rubber composition and hydrolyzable functional group-containing silane (or siloxane). Further, a known filler such as silica may be added to the composition in order to improve the strength of the resulting silicone rubber layer.

In the present invention, the silicone rubber layer ultimately serves as an ink repellent layer. If the thickness of the layer is too small, its ink repellency is lowered and the resulting layer is easily damaged. On the other hand, if the thickness is too great, the developability of the resulting PS plate is impaired. Thus, the thickness preferably ranges from 0.5 to 5 μm and more preferably 1 to 3μm.

In the dry PS plate explained above, it is also possible to apply a variety of other silicone rubber layers on the foregoing silicone rubber layer. Further, an adhesive layer may be applied between the photopolymerizable light-sensitive layer and the silicone rubber layer in order to prevent poisoning of the catalyst present in the composition and to enhance the adhesion between the photopolymerizable light-sensitive layer and the silicone rubber layer.

A polymer coating may be applied to the surface of the silicone rubber layer or a polymer film may be laminated with the silicone rubber layer for protecting the surface of the silicone rubber layer. Examples of such polymer coatings or films include transparent films or coatings such as polyethylene, polypropylene, polyvinyl chloride, polyvinylidene chloride, polyvinyl alcohol, polyethylene terephthalate and cellophane films or coatings. It is also possible to provide a mat layer on the surface of the cover coating layer to ensure close vacuum contact between an original transparency and the surface of the dry PS plate in a vacuum printing frame.

In order to improve the adhesion between the cover coating layer and the mat layer, the cover coating layer may be treated by corona discharge, followed by the application of the mat layer to which a polyester resin or a polyvinylidene chloride resin containing silica powder has been partially applied.

The cover coating layer may be subjected to an antistatic treatment. This prevents the cover coating layer peeled off after imagewise exposure to light but before development from sticking to the operator.

The dry PS plate of the present invention is first imagewise exposed to light through an original transparency and then developed with a developer capable of dissolving or swelling a part or whole of the light-sensitive layer in image areas (unexposed areas) or a developer capable of swelling the silicone rubber layer. During development, either both the light-sensitive layer and the silicone rubber layer in the image areas, or only the silicone rubber layer in the image areas is removed, depending on the strength of the developer.

The developer suitably used in the present invention may be any known developer suitable for developing dry PS plates. Examples include aliphatic hydrocarbons such as hexane, heptane, "Isopar E, H and G" (trade names of the aliphatic hydrocarbons available from ESSO CHEMICAL CO., LTD.), gasoline and kerosine, aromatic hydrocarbons such as toluene and xylene, and halogenated hydrocarbons such as trichloroethylene, to which the below polar solvent is added. The polar solvents may also be used by themselves.

The polar solvents include:

alcohols such as methanol, ethanol, propanol, benzyl alcohol, ethylene glycol monophenyl ether, 2-methoxyethanol, 2-ethoxyethanol, carbitol monoethyl ether, carbitol monomethyl ether, triethylene glycol monoethyl ether, propylene glycol monoethyl ether, dipropylene glycol monomethyl ether, diethylene glycol monohexyl ether, polyethylene glycol monomethyl ether, propylene glycol, tripropylene glycol, polypropylene glycol, triethylene glycol and tetraethylene glycol;

ketones such as acetone and methyl ethyl ketone;

esters such as ethyl acetate, methyl lactate, ethyl lactate, butyl lactate, propylene glycol monomethyl ether acetate, carbitol acetate, dimethyl phthalate and diethyl phthalate; and other polar solvents such as triethyl phosphate and tricresyl phosphate.

It is also possible to use, as a developer, the foregoing organic solvent type developers to which water is added; developers obtained by solubilizing the foregoing organic solvent in water with the aid of a surfactant; developers obtained by adding, to the foregoing developers, an alkaline agent such as sodium carbonate, monoethanolamine, diethanolamine, triethanolamine, sodium silicate, potassium silicate, sodium hydroxide, potassium hydroxide or sodium borate; or tap water by itself or an alkaline water as the case may be.

In the present invention, a dye such as Crystal violet or Astrazone Red can be added to a developer to dye the image simultaneously with the development.

Particularly preferred developers include those containing 0.1 to 100 weight % of propylene oxide derivatives having an average molecular weight of 100 to 1000 as disclosed in J.P. KOKOKU Sho 63-21890 and aqueous developers containing ethylene glycol monoalkyl ether or diethylene glycol monoalkyl ether wherein the alkyl group has 5 to 8 carbon atoms as disclosed in J.P. KOKAI Hei 3-5756 (EP-A-0400657) and Japanese Pat. Application No. Hei 2-27859.

The development of the dry PS plate of the present invention can be performed by any known method, for instance, by rubbing the plate surface with a pad for development containing the foregoing developer or by pouring the developer onto the plate surface and then rubbing the surface with a brush for development in water. Thus, the silicone rubber layer and the light-sensitive layer in the image areas are removed to reveal the surface of the substrate or the primer layer which serves as an ink receiving part, or only the silicone rubber layer is removed to reveal the light-sensitive layer which serves as an ink receiving part.

The dry PS plate of the present invention exhibits excellent anti-contamination characteristics, printing durability and tone reproducibility.

EXAMPLES

The present invention will hereinafter be explained in more detail with reference to the following non-limitative working Examples and Comparative Examples.

EXAMPLES 1 TO 15 AND COMPARATIVE EXAMPLES 1 TO 9

To an aluminum plate (Smooth 1S) having a thickness of 0.3 mm which had been degreased in an usual manner, the following composition for a primer layer was applied and the coated plate was heated at 120° C. for 3 minutes to yield a primer layer of 10 g/m² after drying.

| Component | Amount (part by weight) |
| --- | --- |
| Milk casein | 48 |

| Component | Amount (part by weight) |
|---|---|
| 40% Aqueous solution of glyoxal | 5 |
| Styrene/butadiene rubber latex (solid content: 50%, Tg of film: −20° C.) | 100 |
| Na₂CO₃ | 2.6 |
| TiO₂ | 1 |
| CH₂——CHCH₂OC₃H₆Si(OCH₃)₃ (Adhesion improver for adhesion to the substrate) \\O/ | 3 |
| 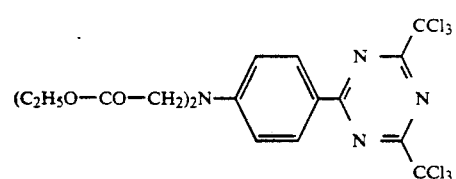 (Yellow dye) | 1.2 |
| CH₂COOC₆H₁₁ \| NaO₃S—CHCOOC₆H₁₁ (Surfactant) | 0.5 |
| Pure water | 700 |

The photopolymerizable light-sensitive solution having the following composition was applied to the surface of the primer layer so that the coating amount was 3 g/m² after drying, and then dried at 100° C. for one minute.

| Component | Amount (part by weight) |
|---|---|
| Copolymer of 2-allyloxyethyl methacrylate/ 2-methacryloxy hydrogen succinate (90/10 mol %) | 2 |
| (CH₂=CHCOOCH₂CH(OH)CH₂OCH₂)₂—CHOH | 0.3 |
| (C₂H₅O—CO—CH₂)₂N—⟨aryl⟩—C(N=CCl₃)(N=CCl₃) | 0.2 |
| Bromophenol Blue (pH indicator) | 0.01 |
| Difenser MCF 323 (DAINIPPON INK AND CHEMICALS, INC.) | 0.02 |
| PF₆ salt of p-diazodiphenylamine/ formaldehyde condensate | 0.02 |
| Propylene glycol monomethyl ether | 15 |
| Methyl ethyl ketone | 10 |

Then, a solution for a silicone rubber layer having the following composition was applied to the photopolymerizable light-sensitive layer thus formed so that the amount thereof coated was 2.0 g/m² after drying. The plate was then dried at 140° C. for 2 minutes to obtain a cured silicon rubber layer.

| Component | Amount (part by weight) |
|---|---|
| 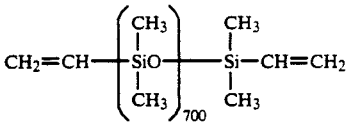 $CH_2=CH-\left(SiO(CH_3)_2\right)_{700}-Si(CH_3)_2-CH=CH_2$ | 9 |
| Hydrogen polysiloxane shown in Table 1 (X was decided so that the number of the ≡Si—H groups of the hydrogen polysiloxane corresponded to 10 times the number of the —CH=CH₂ group of the alkenyl polysiloxane in the composition) | X |
| Polydimethyl siloxane (degree of polymerization = about 8,000) | 0.3 |
| Olefin-chloroplatinic acid | 0.2 |
| Retardant | 0.1 |
| Isopar G (available from ESSO CHEMICAL INC.) | 140 |

The silicone rubber layer thus formed was laminated with a single-side-matted, biaxially oriented polypropylene film (transmission rate for oxygen gas: 4000 cc/m²/24 hr/atm., at 20° C.) having a thickness of 12 μm so that the non-matted surface of the film was brought into contact with the silicone rubber layer to obtain a dry PS plate.

A dot chart having 200 lines/inch were placed on the PS plate, exposed to light for 30 counts through the use of a vacuum light exposure, FT26 V UDNS ULTRA-PLUS FLIPTOP PLATE MAKER (available from Nu Arc CO., LTD.) and then the laminate film was removed. The plate thus treated was immersed in tripropylene glycol at 40° C. for one minute and then rubbed with a developing pad in water to remove the silicone rubber layer in unexposed areas to obtain a lithographic printing plate requiring no dampening water.

The tone reproducibility of the obtained printing plate, which is represented by reproduced dot surface area in highlight or shadow image areas and expressed in percent, was determined.

Then, the resultant lithographic printing plate was set on a Heidelberg GTO printing press from which a device for supplying dampening water had been removed. The printing operation was performed with TOYO KING ULTRA TUK AQUALESS G SUMI INK (available from Toyo Ink Manufacturing Co., Ltd.). Anti-contamination characteristics and printing durability are represented by the number of the sheets printed without contamination before the silicone rubber layer portions of the non-image areas were destroyed.

The results are shown in Table 2.

TABLE 1

| Example No. | Hydrogen polysiloxane | | | | | |
|---|---|---|---|---|---|---|
|  | R¹ | R² | R³ | R⁴ | m | n |
| 1 | CH₃ | CH₃ | CH₃ | CH₃ | 15 | 5 |
| 2 | CH₃ | CH₃ | CH₃ | CH₃ | 13.5 | 6.7 |
| 3 | CH₃ | CH₃ | CH₃ | CH₃ | 10 | 10 |
| 4 | CH₃ | CH₃ | CH₃ | CH₃ | 6.7 | 13.3 |
| 5 | CH₃ | CH₃ | CH₃ | CH₃ | 5 | 15 |
| 6 | CH₃ | CH₃ | CH₃ | CH₃ | 7.5 | 2.5 |
| 7 | CH₃ | CH₃ | CH₃ | CH₃ | 6.7 | 3.3 |
| 8 | CH₃ | CH₃ | CH₃ | CH₃ | 5 | 5 |
| 9 | CH₃ | CH₃ | CH₃ | CH₃ | 3.3 | 6.7 |
| 10 | CH₃ | CH₃ | CH₃ | CH₃ | 2.5 | 7.5 |
| 11 | CH₃ | CH₃ | CH₃ | CH₃ | 15 | 15 |
| 12 | CH₃ | CH₃ | CH₃ | CH₃ | 2.5 | 2.5 |

TABLE 1-continued

| | Hydrogen polysiloxane | | | | | |
|---|---|---|---|---|---|---|
| | $R^1$ | $R^2$ | $R^3$ | $R^4$ | m | n |
| 13 | H | H | $CH_3$ | $CH_3$ | 10 | 10 |
| 14 | $CH_3$ | $CH_3$ | $CH_3$ | $CH=CH_2$ | 10 | 10 |
| 15 | $CH_3$ | $CH_3$ | $CH_3$ |  | 10 | 10 |
| Comparative Example No. | | | | | | |
| 1 | $CH_3$ | $CH_3$ | $CH_3$ | $CH_3$ | 10 | 30 |
| 2 | $CH_3$ | $CH_3$ | $CH_3$ | $CH_3$ | 20 | 20 |
| 3 | $CH_3$ | $CH_3$ | $CH_3$ | $CH_3$ | 20 | 60 |
| 4 | $CH_3$ | $CH_3$ | $CH_3$ | $CH_3$ | 50 | 150 |
| 5 | $CH_3$ | $CH_3$ | $CH_3$ | $CH_3$ | 40 | 0 |
| 6 | $CH_3$ | $CH_3$ | $CH_3$ | $CH_3$ | 2.0 | 2.0 |

TABLE 2

| | Results of Evaluation | | |
|---|---|---|---|
| | Tone Reproducibility | Anti-Contamination Characteristics* | Printing Durability (Sheets) |
| Example No. | | | |
| 1 | 2/97 | C-D | 130,000 |
| 2 | 2/97 | C-D | 120,000 |
| 3 | 2/97 | C | 120,000 |
| 4 | 2/97 | B | 100,000 |
| 5 | 2/97 | B | 80,000 |
| 6 | 2/97 | C | 120,000 |
| 7 | 2/97 | B-C | 110,000 |
| 8 | 2/97 | B | 100,000 |
| 9 | 2/97 | A-B | 90,000 |
| 10 | 1.5/97 | A | 80,000 |
| 11 | 2/97 | C-D | 120,000 |
| 12 | 1.5/97 | A | 70,000 |
| 13 | 1.5/97 | A | 90,000 |
| 14 | 2/97 | B | 100,000 |
| 15 | 2/97 | B | 100,000 |
| Comparative Example No. | | | |
| 1 | 3/97 | D | 100,000 |
| 2 | 3/97 | D-E | 110,000 |
| 3 | 4/97 | E | 110,000 |
| 4 | 6/97 | E | 120,000 |
| 5 | 5/97 | E | 120,000 |
| 6 | 2/97 | A | 40,000 |

Anti-contamination characteristics
A: No contamination
B: Substantially no contamination
C: Slight contamination
D: Moderate contamination
E: Substantial contamination From the results shown in Table 2, it is found that a dry PS plate exhibiting excellent tone reproducibility, anti-contamination property and printing durability can be obtained by using the specific silicone rubber layer according to the present invention.

Examples 16 to 18

An aluminum plate (JIS A 1050) having a thickness of 0.3 mm which had been degreased in the usual manner was immersed in a 1% aqueous solution of an amine silane coupling agent (KBM 603: available from SHIN-ETSU CHEMICAL INDUSTRIES) and dried at room temperature. To the aluminum plate, the following composition for a primer layer was applied, and the plate was heated at 140° C. for 2 minutes to prepare a primer layer of 5 g/m² after drying.

| Component | Amount (part by weight) |
|---|---|
| SANPRENE IB1700D (30% solution of thermoplastic polyurethane resin having terminal hydroxyl groups in methy ethyl ketone, manufactured by SANYO CHEMICALS, INC.) | 10 |
| TAKENATE D110N 75% solution of polyfunctional isocyanate compound in ethyl acetate, manufactured by TAKEDA PHARMACEUTICALS CO., LTD.) | 0.2 |
| $TiO_2$, | 0.2 |
| MCF323 (fluorine atom-containing nonionic surfactant: 30% methyl isobutyl ketone solution manufactured by DAINIPPON INK AND CHEMICALS, INC.) | 0.2 |
| Propylene glycol monomethyl ether acetate | 50 |
| Methyl lactate | 20 |

The photopolymerizable light-sensitive solution having the following composition was applied to the surface of the primaer layer so that the coating amount was 4.0 g/m² after drying, and then dried at 100° C. for one minute.

| Component | Amount (part by weight) |
|---|---|
| Polyurethane consisting of the following components: isophorone diisocyanate (1 mole)/polyester diol having a molecular weight of 2000 and consisting of adipic acid, ethylene glycol and butanediol (0.2 mole)/butanediol (0.4 mole) isophoronediamine (0.4 mole) and chain-extended with the diamine (molecular weight = 50000) | 1.5 |
| Adduct of xylylenediamine (1 mole) and glycidyl methacrylate (4 mole) | 0.8 |
| $CH_2=CHCOO-(CH_2CH_2O)_{14}-COCH=CH_2$ (NK Ester A 600: SIN-NAKAMUKA KAGAKU Co., Ltd.) | 0.7 |
| Ethyl Michler's ketone | 0.2 |
| 2,4-Diethylthioxanthone | 0.1 |
| Naphthalenesulfonate of Victoria Pure Blue BOH | 0.015 |
| MCF323 (fluorine atom-containing nonionic surfactant: 30% methyl isobutyl ketone solution manufactured by DAINIPPON INK AND CHEMICALS INC.) | 0.03 |
| Methyl ethyl ketone | 10 |
| Propylene glycol methyl ether | 20 |

Then, each of the compositions for the silicone rubber layers of Examples 3, 4 and 8 was applied to the photopolymerizable light-sensitive layer thus formed so that the amount thereof coated was 2.0 g/m² after drying. The plates were then dried at 140° C. for 2 minutes to obtain a silicone rubber layer.

Tone reproducibility, anti-contamination characteristics and printing durability of the resultant lithographic printing plate were evaluated in the same manner as in Example 1. The results are shown in Table 3.

TABLE 3

| | Results of Evaluation | | | |
|---|---|---|---|---|
| Example No. | Ex. No. of Silicone Rubber Layer | Tone Reproducibility | Anti-Contamination Characteristics | Printing Durability (Sheet) |
| 16 | 3 | 2/97 | C | 120,000 |
| 17 | 4 | 2/97 | B | 100,000 |

TABLE 3-continued

| Example No. | Ex. No. of Silicone Rubber Layer | Tone Reproducibility | Anti-Contamination Characteristics | Printing Durability (Sheet) |
|---|---|---|---|---|
| 18 | 8 | 2/97 | B | 110,000 |

The results shown in Table 3 clearly demonstrate that the dry PS plates according to the present invention exhibit excellent tone reproducibility as well as excellent anticontamination property and printing durability in the resulting printing plates.

We claim:

1. A dry PS plate which comprises a substrate provided thereon with a photopolymerizable light-sensitive layer and a silicone rubber layer in that order, wherein the photopolymerizable light-sensitive layer comprises: (a) a monomer or oligomer having at least one photopolymerizable olefinically unsaturated double bond; (b) an organic solvent-soluble polymeric compound being solid at room temperature and having film-forming ability; and (c) a photopolymerization initiator and wherein the silicone rubber layer comprises a product obtained by crosslinking through addition reaction the following components:

(A) an alkenylpolysiloxane having at least two alkenyl groups directly bonded to the silicon atoms in each molecule thereof; and (B) a hydrogen polysiloxane of the following general formula I:

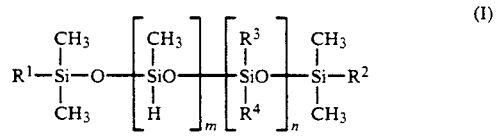

wherein $R^1$ and $R^2$ independently represent a hydrogen atom or methyl group, $R_3$ and $R^4$ independently represent a methyl, vinyl or phenyl group, $m+n$ is 5 to 30 and $m:n$ is 3:1 to 1:3.

2. The dry PS plate of claim 1 wherein the alkenyl group of the component (A) is selected from the group consisting of vinyl, allyl, butenyl, hexenyl and decenyl groups.

3. The dry PS plate of claim 1 wherein the component (A) contains organic groups, other than the alkenyl group, directly bonded to the silicon atoms, said organic groups being selected from the group consisting of alkyl groups; aryl groups; aralkyl groups; and halogen-substituted hydrocarbon groups.

4. The dry PS plate of claim 3 wherein the component (B) contains methyl groups as the organic groups.

5. The dry PS plate of claim 1 wherein the viscosity of the component (A) is not less than 60 cs.

6. The dry PS plate of claim 1 wherein the alkenylpolysiloxane and the hydrogen polysiloxane are mixed so that the mixture contains more than 1 equivalent of SiH groups to the carbon/carbon unsaturated group.

7. The dry PS plate of claim 1 wherein the silicone rubber layer comprises a filler.

8. The dry PS plate of claim 1 wherein the silicone rubber layer has a thickness of 0.5 to 5 μm.

9. The dry PS plate of claim 1 wherein the silicone rubber layer has another silicone rubber layer applied thereon.

10. The dry PS plate of claim 1 wherein the silicone rubber layer between the photopolymerizable light-sensitive layer and the silicone rubber layer.

11. The dry PS plate of claim 1 wherein the silicone rubber layer rubber layer has a polymer coating or laminated with a polymer film applied thereon.

12. The dry PS plate of claim 1 wherein the photopolymerizable light-sensitive layer contains the monomer or oligomer in an amount of 5 to 75% by weight based on the total solid weight of the photopolymerizable light-sensitive layer.

13. The dry PS plate of claim 1 wherein the photopolymerizable light-sensitive layer contains the film-forming polymeric compound in an amount of 30 to 99% by weight based on the total solid weight of the monomer or oligomer and the film-forming polymeric compound.

14. The dry PS plate of claim 1 wherein the photopolymerizable light-sensitive layer contains the photopolymerizable initiator in an amount of 0.1 to 20% by weight based on the total solid weight of the photopolymerizable light-sensitive layer.

15. The dry PS plate of claim 1 wherein the film-forming polymeric compound is selected from the group consisting of polyurethane resin and polyamide resin.

16. The dry PS plate of claim 1 further comprising a primer layer.

17. The dry PS plate of claim 16 wherein the primer layer comprises at least one member selected from the group consisting of a material obtained by heat curing an epoxy resin; a material obtained by hardening a gelating film; an urethane resin; and a hardened casein.

18. The dry PS plate of claim 17 wherein the primer layer further comprises at least one member selected from the group consisting of polyurethanes, polyamides, styrene/butadiene rubbers, carboxyl-modified styrene/butadiene rubbers, acrylonitrile/butadiene rubbers, carboxylic acid-modified acrylonitrile/butadiene rubbers, polyisoprenes, acrylate rubbers, polyethylene, chlorinated polyethylenes and chlorinated polypropylenes.

19. The dry PS plate of claim 6 wherein the alkenylpolysiloxane and the hydrogen polysiloxane are mixed so that the mixture contains 3 to 15 equivalents of SiH group to the carbon/carbon unsaturated group.

20. The dry PS plate of claim 10 wherein the primer layer comprises a material obtained by exposing to light a light-sensitive polymer to cure the polymer prior to the application of the light-sensitive resin layer.

* * * * *